(12) United States Patent
Kim et al.

(10) Patent No.: US 10,048,520 B2
(45) Date of Patent: Aug. 14, 2018

(54) OPTICAL ISOLATOR

(71) Applicant: GWANGJU INSTITUTE OF SCIENCE AND TECHNOLOGY, Gwangju (KR)

(72) Inventors: Bok-Hyeon Kim, Gwangju (KR); Hoon-Soo Kang, Gwangju (KR)

(73) Assignee: GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 290 days.

(21) Appl. No.: 14/979,541

(22) Filed: Dec. 28, 2015

(65) Prior Publication Data

US 2016/0187675 A1   Jun. 30, 2016

(30) Foreign Application Priority Data

Dec. 30, 2014  (KR) .......................... 10-2014-0193532

(51) Int. Cl.
| | |
|---|---|
| *H01J 40/14* | (2006.01) |
| *G02F 1/09* | (2006.01) |
| *G02B 6/27* | (2006.01) |
| *G02B 5/22* | (2006.01) |
| *G02B 5/28* | (2006.01) |
| *H01S 5/00* | (2006.01) |

(Continued)

(52) U.S. Cl.
CPC ............... *G02F 1/093* (2013.01); *G02B 5/22* (2013.01); *G02B 5/281* (2013.01); *G02B 6/2706* (2013.01); *G02B 6/2746* (2013.01); *H01S 5/0064* (2013.01); *H01S 5/0078* (2013.01); *H01S 3/0675* (2013.01); *H01S 3/09415* (2013.01); *H01S 3/094011* (2013.01)

(58) Field of Classification Search
CPC .......... G02B 5/22; G02B 5/26; G02B 6/2746; H01S 3/0064
USPC ................... 250/216, 227.11; 385/27, 39, 73
See application file for complete search history.

(56) References Cited

U.S. PATENT DOCUMENTS

| | | | |
|---|---|---|---|
| 4,548,478 A | 10/1985 | Shirasaki | |
| 5,825,950 A * | 10/1998 | Cheng | .................. G02B 6/2746 372/703 |
| 2015/0139263 A1* | 5/2015 | Sutter | ............... H01S 3/094084 372/70 |

FOREIGN PATENT DOCUMENTS

KR   1020130110286 A   10/2013

OTHER PUBLICATIONS

Shiraishi et al, "Polarization-Independent In-line Optical Isolator with Lens-Free Configuration," Journal of Lightwave Technology, Dec. 1992, pp. 1839-1842, vol. 10, No. 12.

* cited by examiner

*Primary Examiner* — Kevin Pyo
(74) *Attorney, Agent, or Firm* — Hauptman Ham, LLP

(57) ABSTRACT

An optical isolator includes: an input-side lens converting an operating light incident in a forward direction via an optical fiber input end into parallel light beams; an input-side polarizer disposed on a right hand of the input-side lens; a Faraday rotator rotating a polarization plane of the operating light having been converted into the parallel light beams; an output-side polarizer disposed on an output side of the Faraday rotator; an output-side lens transmitting the operating light having passed through the output-side polarizer; an optical filter blocking light leakage and transmitting the operating light; an optical fiber output end that the operating light exits; and a housing accommodating the input-side lens, the input-side polarizer, the Faraday rotator, the output- (Continued)

side polarizer, the output-side lens, the optical filter and the optical fiber output end therein to enclose them.

20 Claims, 10 Drawing Sheets

(51) Int. Cl.
*H01S 3/067* (2006.01)
*H01S 3/094* (2006.01)
*H01S 3/0941* (2006.01)

Prior Art

Prior Art

OPTICAL ISOLATOR

CROSS-REFERENCE TO RELATED APPLICATIONS

This application claims the priority of Korean Patent Application No. KR 10-2014-0193532 filed on Dec. 30, 2014, in the Korean Intellectual Property Office, the disclosure of which is incorporated herein by reference.

BACKGROUND

1. Technical Field

The present disclosure relates to an optical isolator.

2. Description of the Related Art

Recently, optical fiber lasers are attracting a lot of attention. This is because optical fiber lasers have many advantages such as good beam forming characteristics, high power efficiency, output power stability, cost-efficiency and lightness, etc.

The optical fiber laser may include: a gain fiber such as an optical fiber doped with rare-earth ions used as a gain medium; an optical fiber grating acting as a reflection mirror of a laser cavity; a pump light source such as a laser diode; a seed light source or seed laser; and a optical fiber delivery that delivers an output laser beam to a desired destination.

Typically, a laser beam emitted from a laser can be reflected to return to the laser for several factors. This causes problems such as distortion in the laser beam or damage to optical components. To overcome such problems, an optical isolator is employed that transmits a laser beam emitted from a laser and blocks a laser beam returning back to the laser.

Examples of the optical isolator include a polarization dependent isolator that operates only in a particular polarization direction and a polarization independent isolator that operates regardless of a polarization direction. For more details, reference is made to U.S. Pat. No. 4,548,478 and the paper "*Polarization-independent in-line optical isolator with lens free configuration*," published in Journal of Lightwave Technology, Vol. 10, p. 1839, 1992. A typical optical isolator essentially includes a polarizer and a Faraday rotator, and optionally includes a wave plate, a polarization rotator and a silt. There is a problem in that such optical components may not operate properly at a desired wavelength due to wavelength-specific characteristics, especially dispersion characteristics of the rotator and polarizer, so that optical isolation may fail. This may result in breaking laser optical components such as the pump light source, the seed light source, etc., and also optical components inside the optical isolator.

Moreover, optical fiber lasers have high power above several kW and generate ultrashort output pulses, such that they are becoming more complicated. A master oscillator power amplifier (MOPA) system may be one example for the complicated structure. Furthermore, various kinds of light leakage may occur in an optical fiber laser to thereby damage laser optical components or deteriorate the performance thereof. Examples of light leakage may include oscillating laser light and pump light. Even when the relative amount of a light leakage is small, for example, a leakage of oscillating laser light that is not blocked by a laser cavity may easily damage a pump light source and in turn break an optical isolator and cause the optical isolator to deteriorate as the power of the optical fiber laser increases. For another example, pump light that is not completely absorbed by a gain fiber and leaks may break other laser optical components, especially a seed light source, or deteriorate the performance thereof.

FIG. 9 is a diagram for illustrating a configuration of an optical fiber laser system in the related art.

Referring to FIG. 9, pump light emitted from a plurality of laser diodes acting as pump light sources passes through a pump combiner, and is incident on a laser cavity consisting of a pair of fiber Bragg gratings (FBGs) and a gain fiber doped with rare-earth ions therebetween. In the laser cavity, laser light is amplified by receiving the energy of the pump light and oscillates at a particular oscillation wavelength. Finally, a laser light is emitted via an output end disposed on the right hand of the laser cavity, and is ready to be used. Generally, the left one of the fiber Bragg gratings, which is closer to the pump light source, has a reflectivity between 99% and 99.9% at laser oscillation wavelength, such that majority of laser light oscillating in the laser cavity is reflected toward the right hand thereof. However, some of the oscillating laser light may pass through the left one of the fiber Bragg gratings to leak toward the pump light source. Such light leakage is ignorable in a laser system having a low power. However, in a laser system having a high power, light leakage may break a pump light source and other laser optical components.

FIG. 10 is a diagram for illustrating another optical fiber laser system in the related art.

Referring to FIG. 10, a laser system includes: a seed light source used as a light source for laser; an optical isolator operating at the wavelength of the seed light source; and an amplification unit consisting of pump light sources each including a plurality of laser diodes, pump combiners connected to the respective pump light sources, and a gain fiber disposed between the pump combiners. Some of pump light generated in a pump light source disposed on the right side of the gain fiber may not be completely absorbed by the gain optical fiber and thus fail to be converted into oscillating laser light. Accordingly, some of the pump light may leak toward the seed light source. Generally, an optical isolator disposed at the output end of the seed light source operates at the wavelength of the seed light source but does not operate at the wavelength of the pump light. As a result, the seed light source is likely to be damaged. For example, for an optical fiber laser system at 1,550 nm implemented using an optical fiber doped with erbium (Er) ions, the wavelength of the seed light source may be 1,550 nm and the wavelength of the pump wavelength may be 980 nm. In this example, an optical isolator for a seed beam operates at 1,550 nm, and thus leacked pump light at 980 nm cannot be blocked effectively.

To overcome this problem, Korean Patent Application No. 10-2012-0032097 discloses an optical fiber for protecting a laser pump light source, in which ions for absorbing an oscillating laser light is doped in an optical fiber, based on the idea that the absorptivity of the optical fiber is higher in the oscillation wavelength range than in the pump wavelength range. However, the approach requires disposing a specially-treated optical fiber on the optical path additionally, and thus is not desirable in terms of cost, processing time and manufacturing difficulty. In addition, according to the approach, only the pump light source below a short-wavelength range (below 990 nm) can be protected from an oscillating laser light (above 1,030 nm).

In addition, in order to ensure that pump light sources are protected and components are prevented from being degraded and damaged, it may be contemplated to apply a filter for blocking an oscillating laser light on the pump light source. However, this requires applying a coating process on every pump light source, and is thus undesirable in terms of cost, processing time and manufacturing difficulty. In addition, this technique has a limited maximum efficiency of blocking light leakage. Accordingly, what is required is a method for blocking light leakage simply and efficiently.

RELATED ART REFERENCES

Patent Reference

Reference 1: U.S. Pat. No. 4,548,478 (FIGS. 1 and 3 and descriptions thereof)
Reference 2: Korean Laid-Open Patent Publication No. 10-2013-0110286

Non-Patent Reference

Reference 3: the paper "*Polarization-independent in-line optical isolator with lens free configuration,*" published in Journal of Lightwave Technology, Vol. 10, p. 1839, 1992

SUMMARY

It is an aspect of the present disclosure to provide an optical isolator capable of protecting a pump light source, a seed light source, internal components therein or other laser optical components by blocking light leakage such as oscillating laser light or pump light, and improving the performance of the optical isolator without using any additional component, thereby allowing for implementing a simple and less expensive laser system.

In accordance with one aspect of the present disclosure, an optical isolator includes: an input-side lens converting an operating light incident in a forward direction via an optical fiber input end into parallel light beams; an input-side polarizer disposed on a output side of the input-side lens; a Faraday rotator rotating a polarization plane of the operating light having been converted into the parallel light beams; an output-side polarizer disposed on an output side of the Faraday rotator; an output-side lens transmitting the operating light having passed through the output-side polarizer; an optical filter blocking light leakage and transmitting the operating light; an optical fiber output end that the operating light exits; and a housing accommodating the input-side lens, the input-side polarizer, the Faraday rotator, the output-side polarizer, the output-side lens, the optical filter and the optical fiber output end therein to enclose them. According to the exemplary embodiment, by disposing an optical filter having predetermined functionalities in an optical isolator, a pump light source and a seed light source can be protected from light leakage and internal components in the optical isolator can be protected and the performance thereof can be improved simply and inexpensively. The optical isolator may further include: at least one selected from one or more lenses, Faraday rotators, polarizers, wave plates, polarization rotators, birefringent plates, slits, mirrors and prisms, between the input-side lens and the output-side lens.

The optical filter may be disposed between the output-side lens and the output-side polarizer. By doing so, the internal components of the optical isolator can be protected more reliably.

The optical filter may be a wavelength-selective, absorptive optical filter absorbing the light leakage. This allows only light leakage to be blocked. The wavelength-selective, absorptive optical filter may be disposed between the optical fiber input end, the input-side lens, the input-side polarizer, the Faraday rotator, the output-side polarizer, the output-side lens and the optical fiber output end or provided together with at least one selected from one or more lenses, Faraday rotators, polarizers, wave plates, polarization rotators, birefringent plates, slits, mirrors and prisms, between the input-side lens and the output-side lens. This allows light leakage to be blocked more conveniently. Further, this can be applied for a variety of light leakage.

The optical filter may be a wavelength-selective, reflective optical filter reflecting the light leakage. The wavelength-selective, reflective optical filter may be disposed between the optical fiber input end, the input-side lens, the input-side polarizer, the Faraday rotator, the output-side polarizer, the output-side lens and the optical fiber output end or provided together with at least one selected from one or more lenses, Faraday rotators, polarizers, wave plates, polarization rotators, birefringent plates, slits, mirrors and prisms, between the input-side lens and the output-side lens.

The optical filter may be at least one of a notch filter, a short pass filter, a long pass filter, a band pass filter, a wavelength dependent beam splitter and a wavelength dependent mirror. This allows light leakage to be blocked by using an appropriate one of the optical filters depending on the wavelength range of the light leakage.

The optical filter may reflect the light leakage, and the optical isolator may further include an absorber absorbing the reflected light leakage. This allows heat generate by the light leakage in the optical isolator to be removed. The optical isolator may further include a sensor measuring the condition of the absorber. This allows the power of the light leakage to be sensed based on the emitted heat. The optical isolator may further include a heat sink removing heat of the absorber, so that heat can be discharged more quickly.

The optical filter may reflect the light leakage, and the optical isolator may further include an optical window discharging the reflected light leakage out of the optical isolator.

The optical filter may reflect the light leakage, and the optical isolator may further include an opto-electric converter detecting the reflected light leakage. This allows the intensity of the light leakage to be measured so as to examine the condition of the optical fiber laser.

In accordance with another aspect of the present disclosure, an optical isolator includes: an input-side polarizer on which an operating light is incident as parallel light beams; a Faraday rotator rotating a polarization plane of the operating light having passed through the input-side polarizer; an output-side polarizer that the operating light having passed through the Faraday rotator passes; and an optical filter transmitting the operating light and blocking light leakage based on a wavelength difference between the operating light and the light leakage. By adding an optical filter to the optical isolator operating in a variety of manners, the performance of the optical isolator may be maximized.

The optical isolator may further include: an input-side lens converting the operating light incident via an optical fiber input end into parallel light beams to deliver them to the input-side polarizer. The optical isolator may further include: at least one selected from one or more lenses, Faraday rotators, polarizers, wave plates, polarization rotators, birefringent plates, slits, mirrors and prisms, between the input-side polarizer and the output-side polarizer. The optical isolator may include: an absorber absorbing light leakage reflected by the optical filter; and a heat sink discharging a heat of the absorber. The optical isolator may include: an absorber absorbing light leakage reflected by the optical filter; and a sensor measuring a temperature of the absorber. The optical isolator may include: an optical window via which light leakage reflected by the optical filter exits. The optical isolator may include: an opto-electric converter measuring light leakage reflected by the optical filter.

According to exemplary embodiments of the present disclosure, a pump light source, a seed light source, internal components of the optical isolator and other laser optical components can be protected reliably. In addition, the overall optical fiber laser system can be implemented at a lower cost by improving the performance of the optical isolator to overcome the light leakage issue of the laser system. In some embodiments, the characteristics, i.e., the intensity and wavelength of light leakage can be monitored. Moreover, the light leakage issue can be easily overcome by simply replacing an optical isolator in an existing optical fiber laser with the optical isolator according to any one of the exemplary embodiments of the present disclosure. Accordingly, the optical isolator exhibits high industrial applicability.

DETAILED DESCRIPTION

Embodiments of the present disclosure will now be described in detail with reference to the accompanying drawings. However, it should be noted that the scope of the present disclosure is not limited to the embodiments set forth herein; and those skilled in the art, having benefit of this detailed description, will appreciate that other equivalent embodiments are possible by adding, modifying and eliminating elements, which are also construed as falling within the scope of the present disclosure.

First Embodiment

Figure 1:
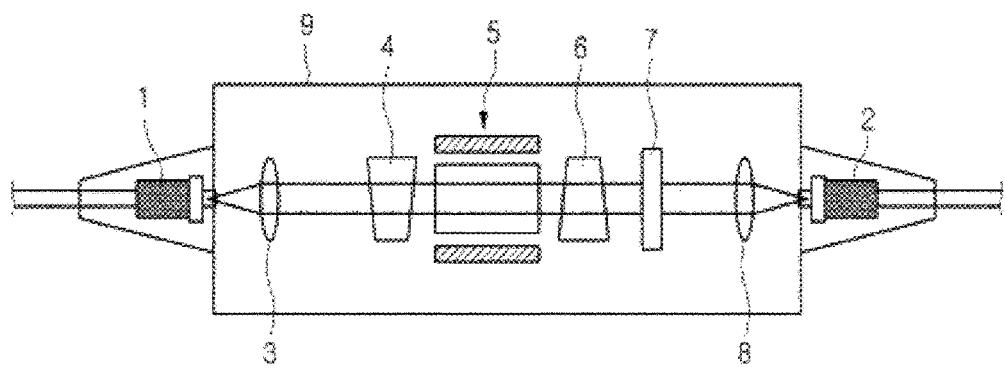
FIG. 1 is a view for illustrating an optical isolator according to a first embodiment.

FIG. 1 is a view for illustrating an optical isolator according to a first embodiment.

Referring to FIG. 1, there are provided an optical fiber input end and an optical fiber output end 2. A light incident on the optical fiber input end 1 is shaped into parallel light beams by an input-side lens 3. The parallel light beams pass through an input-side polarizer 4. Then, the parallel light beams pass through an output-side polarizer 6 with its polarization wave plane rotated by the Faraday rotator 5. The light beams exiting the output-side polarizer 6 then pass through an optical filter 7, are collimated by an output-side lens 8, and exit the optical fiber output end 2. In addition, there is provided a housing 9 accommodating the above components to enclose them.

The input-side lens 3 and the output-side lens 8 are collimators or collimation lenses or may be a kind of lens systems. The optical fiber input end 1 may be integrated with the input-side lens 3, and the optical fiber output end 2 may be integrated with the output-side lens 8. Alternatively, a lensed fiber, a thermally expanded core (TEC) fiber, a graded-index (GRIN) fiber, etc., whose ends have functionality of lenses may be used. The input-side polarizer 4 and the output-side polarizer 6 may be spatial walk-off polarizers or non-spatial walk-off polarizers.

Specifically, the spatial walk-off polarizer is used in a polarization independent optical isolator. When a light with an arbitrary orientation of polarization is incident on the spatial walk-off polarizer at input-side, the incident light branches into two light beams in the polarization orientation due to the birefringent property of the spatial walk-off polarizer. The light beams propagate in parallel to the output-side spatial walk-off polarizer with an offset distance therebetween. Then, the light beams pass through the output-side spatial walk-off polarizer disposed in the optical isolator and are combined into a light. Finally, the light propagates to the output end.

On the other hand, the non-spatial walk-off polarizer is used in a polarization dependent isolator and is made up of common and much simple structure. The non-spatial walk-off polarizer is generally used in a laser system using light polarized linearly. When the non-spatial walk-off polarizer is employed, the polarization orientation of an incident light is coincident with the polarization orientation of the input-side non-spatial walk-off polarizer in order to reduce optical loss. Unlike the spatial walk-off polarizer, the light does not branch into two light beams when it passes through the input-side polarizer. Then, the light remains as a single light beam until it passes through the output-side non-spatial walk-off polarizer disposed in the optical isolator.

The polarizers 4 and 6 may be a walk-off polarizer and a non walk-off polarizer such as an absorptive polarizer, a beam splitting polarizer, a thin film polarizer, a birefringent polarizer, and a wire-grid polarizer. The Faraday rotator 5 may consist of a magnet and a magneto-optic material disposed inside the magnet.

The behavior of the Faraday rotator 5 will be described in detail.

The Faraday rotator 5 rotates the polarization plane of light. Specifically, by adjusting the characteristics of the Faraday rotator, the polarization plane is rotated by the amount corresponding to the angle by which the polarization axis of the output-side polarizer 6 is deviated from the axis of the input-side polarizer 4, so that the incident light passes through the optical isolator with minimized loss. In the case of a backward propagating light in a polarization dependent optical isolator, on the other hand, the light propagates in the opposite direction to the incident light, i.e., from the output-side polarizer 6 to the input-side polarizer 4, even if it passes through the output-side polarizer 6 and the Faraday rotator 5, the polarization orientation of the backward propagating light is not coincident with the polarization axis of the input-side polarizer 4. As a result, the backward propagating light at the operating wavelengths of the optical isolator cannot pass through the input-side polarizer 4 but is blocked. In addition, in a polarization independent optical isolator, when a backward propagating light propagates from the output-side polarizer 6 to the input-side polarizer 4 in a polarization independent optical isolator, the backward propagating light is refracted by the input-side polarizer 4 even if it passes through the output-side polarizer 6 and the Faraday rotator 5, such that the propagation direction of the backward propagating light does not coincident with the optical fiber input end 1. As a result, the backward propagating light is blocked effectively at the operating wavelength, similarly to the polarization dependent optical isolator.

However, when the backward propagating light is out of the operating wavelength of the optical isolator, there are problems in polarization rotation of the Faraday rotator and refraction of the polarizers due to dispersion characteristics of the Faraday rotator and the polarizers. Accordingly, blocking efficiency of oscillating laser light or pump light decreases, so that leakage problem of backward propagating light may be happen. This problem becomes serious as the output power of the optical fiber laser increases.

To overcome such a problem, a filtering component that transmits the operating light and reflects or absorbs a light leakage is employed as the optical filter 7. As used herein, the operating light refers to a light beam propagating in the forward direction and passing through the optical isolator with minimized loss. It will be easily understood that a pump light or a seed laser may be applied as an operating light in a laser system as described above with respect to the example in the related art.

The behavior of the optical filter 7 will be described.

For an optical fiber laser made by an optical fiber doped with ytterbium ions ($Yb^{3+}$) as a gain medium, for example, a laser diode having an output wavelength near 915 nm or 975 nm is used as a pump light source, and a laser light oscillation is obtained around 1,064 nm. A wavelength gap between the pump light and the oscillating laser light has a large value of approximately 149 nm or 89 nm. If an existing optical isolator operable at the wavelength of 915 nm is employed for protecting the pump light source, the optical isolator operates well at the operating wavelength so that a pump light of 915 nm propagating in the backward direction can be blocked well. However, some of oscillating light around 1,064 nm generated in a laser cavity may leak and pass through the optical isolator in the backward direction. As a result, such leaked oscillating light in the backward direction may damage the pump light source, i.e., the laser diode. To solve this problem, the optical filter 7 is employed to block the oscillating light around 1,064 nm from propagating in the backward direction.

Accordingly, as described above, in the optical isolator that functions well at the operating wavelength, i.e., pump wavelength but deteriorates at the wavelength of the light leakage, i.e., oscillation wavelength of the laser light due to the dispersion characteristics of the Faraday rotator and polarizer, laser optical components such as pump light sources can be protected by blocking oscillating laser light propagating in the backward direction or leaking.

The structure of an optical isolator may be modified depending on wavelength characteristics, a power range, light dispersion characteristics, thermal characteristics, etc., required by a laser system. Accordingly, one or more Faraday rotators, polarizers and lenses may be used in the optical isolator, as necessary. In addition, the optical isolator may include therein one or more wave plates such as half wave plates and quarter wave plates, one or more polarization rotators, one or more birefringent plates, one or more slits, one or more mirrors, one or more prisms, etc. One technical idea of the present disclosure, i.e., blocking light leakage by using the optical filter 7 is equally applied irrespective of the numbers of the elements. The wave plates, the polarization rotators, the birefringent plates are optical elements used with the walk-off polarizer for achieving optical isolation functionality according to required polarization property in a polarization independent optical isolator. In addition, the wave plate, the polarization rotator, the birefringent plate, the slit, the mirror, the prisms may be used as internal component of the optical isolator to improve high power and dispersion characteristics.

The types of optical filters that can be used as the optical filter 7 will be described with reference to the drawings.

Figure 2:
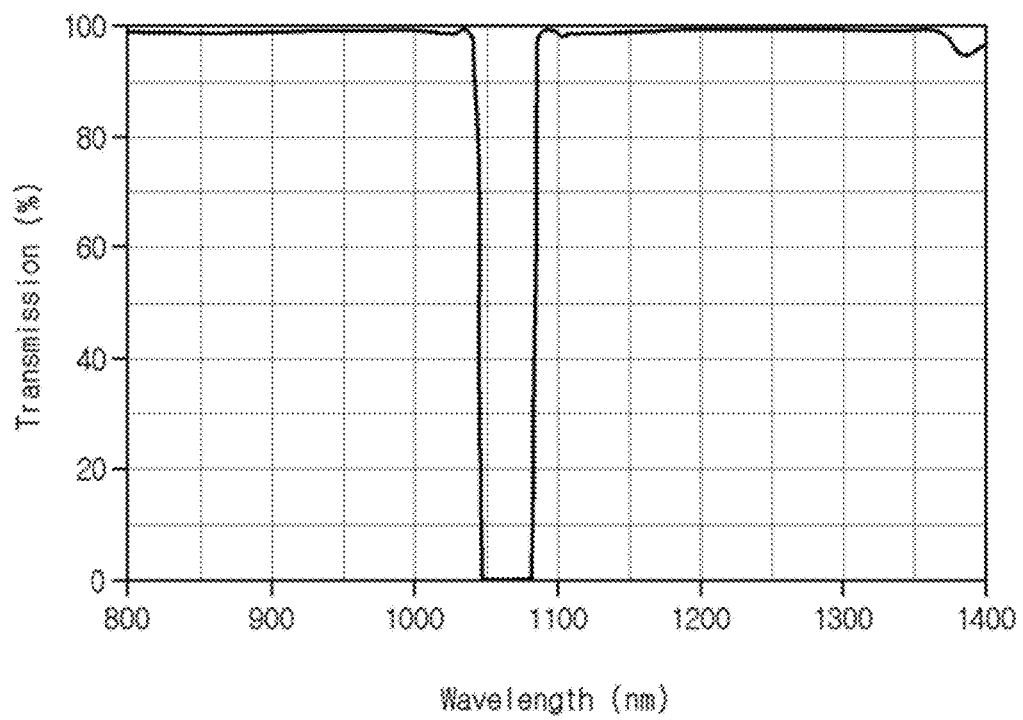
FIG. 2 is a graph showing characteristics of a notch filter used in the first embodiment.

FIG. 2 is a graph showing transmission characteristics of a notch filter.

In the example shown in FIG. 2 where an NF1064-44 is used as the notch filter, an operating light having a wavelength below 1,050 nm and above 1,080 nm passes through the notch filter, and a laser light leakage having a wavelength ranging between 1,050 nm and 1,080 nm is blocked.

Accordingly, for an optical fiber laser made by an gain fiber doped with yttrium ion ($Yb^{3+}$), for example, a pump light around 915 nm or 975 nm as an operating light propagating in the forward direction well passes through the notch filter used as the optical filter 7, and an oscillating laser light around 1,064 nm as light leakage propagating in the backward direction is blocked by the filter. As a result, the filter can improve the functionality of an optical isolator or laser system by blocking a laser light leakage that propagates in the backward direction from the output side to the input side of the optical isolator to potentially break a component such as a laser diode. It is to be understood that any notch filter other than the NF1064-44 may also be used. Notch filters having high optical damage threshold characteristics may be preferred for high power laser systems.

In this example, it is not required to coat every laser diode used as the pump light source, which is cumbersome. In particular, when a number of laser diodes are used for achieving high power laser output, by disposing optical filters on a small number of optical isolators, it is possible to implement an optical fiber laser conveniently at a lower cost. Further, internal components of the optical isolator can be protected from laser light leakage.

Figure 3:
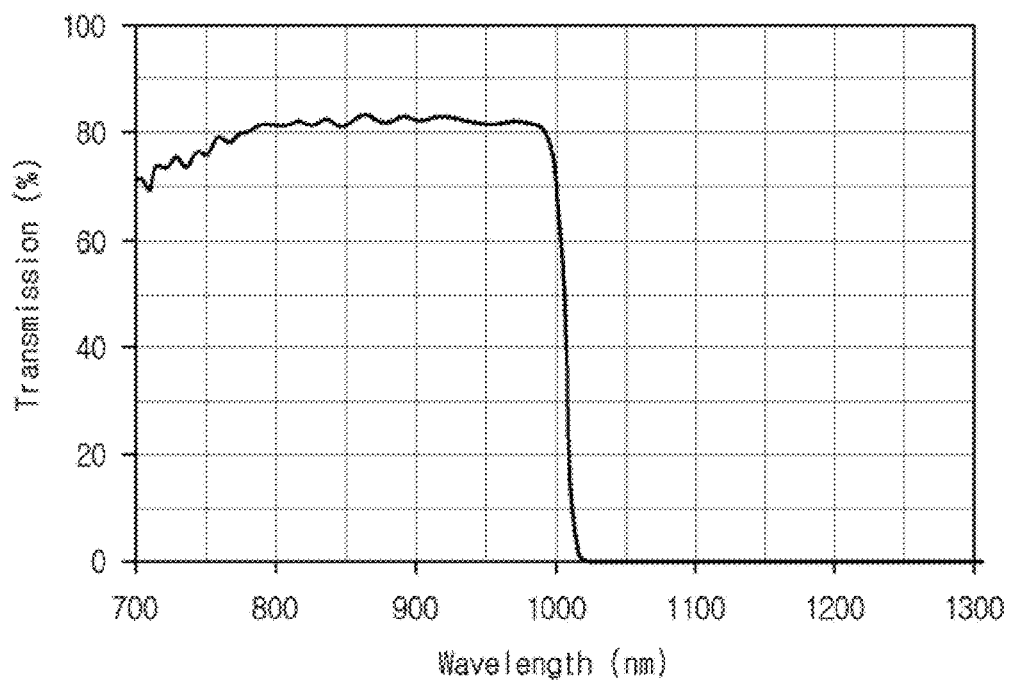
FIG. 3 is a graph showing characteristics of a short pass filter.

FIG. 3 is a graph showing transmission characteristics of a short pass filter.

In the example shown in FIG. 3 where a FES1000 is used as the short pass filter, a laser light leakage above 1,000 nm is blocked. Accordingly, for an optical fiber laser made by an gain fiber doped with yttrium ion ($Yb^{3+}$), for example, a pump light around 915 nm or 975 nm propagating toward the output side of the short pass filter passes through it, and an oscillating laser light around 1,064 nm propagating in the backward direction is blocked. As a result, the filter can improve the functionality of an optical isolator or laser system by blocking a laser light leakage that propagates in the backward direction from the output side to the input side of the optical isolator to potentially break a component such as a laser diode. It is to be understood that any short pass filter other than the FES1000 may also be used. Short pass filters having high optical damage threshold characteristics may be preferred for high power laser systems.

In this example, it is not required to coat every laser diode used as the pump light source, which is cumbersome, as well as the laser system can be constructed at a lower cost. In addition, the internal components of the optical isolator can be protected from laser light leakage.

As another example, light leakage can be easily blocked by selecting the specification of the optical filter 7 appropriately for the system. For example, when a pump light with a short wavelength leaks, a long pass filter is employed as the optical filter 7 in order to protect a seed light source used at a long wavelength from the leaked light. For example, in a laser system in which a seed laser at 1,550 nm is amplified by a pump light at 980 nm, if a long pass filter transmitting a wavelength above 1,000 nm is employed, a seed laser (seed light) at a long wavelength range passes through the long pass filter, whereas a leaked pump light at a short wavelength range is blocked. As a result, it is possible to prevent laser components such as the seed light source from being damaged or deteriorating by the leaking pump light leakage.

In this example, it is not required to employ an expensive optical isolator operated at the both wavelengths of the seed laser and the pump light at the output end of the seed light source, and thus the optical fiber laser can be implemented at a lower cost. In addition, the internal components of the optical isolator can be protected from laser light leakage.

The notch filter, the short pass filter and the long pass filter can be disposed with a predetermined angle and not vertical with respect to the optical axis of the direction in which the operating light or the light leakage propagates, such that light can be transmitted, absorbed or reflected depending on its wavelength. The notch filter is preferred when light leakage occurs at a narrow wavelength range. The short pass filter and the long pass filter are preferred when light leakage occurs at a broad wavelength range.

Figure 4:
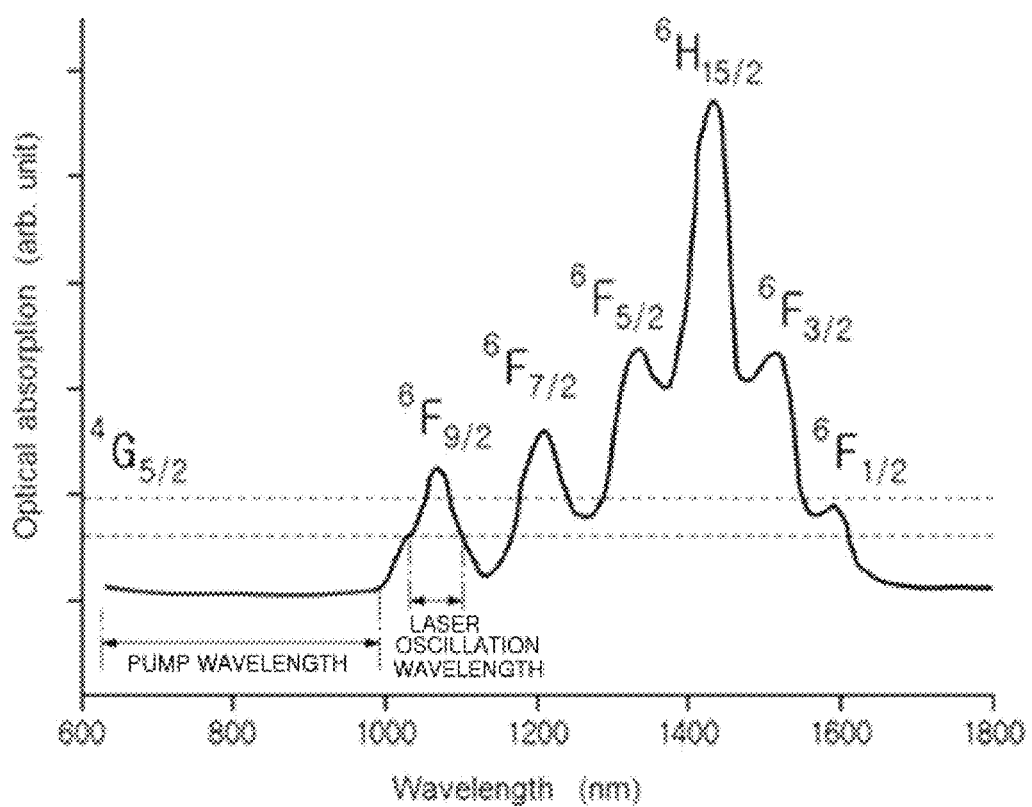
FIG. 4 is a graph showing characteristics of a wavelength-selective, absorptive optical filter.

FIG. 4 is a graph showing optical absorption characteristics of a wavelength-selective, absorptive optical filter.

In the case of an optical fiber laser made by a gain fiber doped with yttrium ions ($Yb^{3+}$) as shown in FIG. 4, an oscillating laser light between 1,000 nm and 1,100 nm can be absorbed by a wavelength-selective, absorptive optical filter employed. FIG. 4 shows the absorption spectrum of an absorptive optical filter made by an optical glass doped with samarium (Sm), for example. Since the optical characteristics of the wavelength-selective, absorptive optical filter are not strongly affected by the orientation in which it is aligned, it can be disposed irrespective of the direction of the optical axis. For example, accordingly, it may be coated on or attached to the output side lens 8. Although the absorptive optical filter may be coated on or attached to other components such as the output-side polarizer, it is more desirable to block the light leakage propagating in the backward direction at the output side immediately in terms of protecting other internal components of the optical isolator and heat dissipation.

The wavelength-selective, absorptive optical filter is preferred when light leakage occurs at a number of ranges. In addition, the wavelength-selective, absorptive optical filter may be made by an optical material doped with an element exhibiting optical absorption characteristics at various wavelength ranges. For example, the wavelength-selective, absorptive optical filter may be made by a ceramic or an optical glass doped with a rare-earth element, a transition metal element or a semiconductor substance exhibiting wavelength-dependent absorption characteristics at various wavelength ranges.

In the first exemplary embodiment of the present disclosure, a band pass filter that transmits a pump light can be used as the optical filter 7. The central wavelength of the band pass filter may be coincident with the wavelength of the operating light. Accordingly, in this example, the operating light is transmitted and light leakage out of the operating wavelength range is blocked. The band pass filter can be a feature disposed perpendicular to the optical axis. The band pass filter is more preferred when light leakage occurs at a number of ranges.

In the first exemplary embodiment of the present disclosure, the optical filter 7 may be disposed between the optical fiber input end 1 and the optical output end 2. Preferably, the optical filter 7 may be disposed between the input-side lens 3 and the output-side lens 8. This is because it is easier for aligning light to block the light leakage when it is expanded and becomes parallel light beams after having passed through the output-side lens 8, and it can prevent the optical filter 7 from being damaged due to concentration of light. More preferably, the optical filter 7 may be disposed between the output-side polarizer 6 and the output-side lens 8. This is because other internal components of the optical isolator may also be damaged or deteriorated by the high power light leakage having high power that propagates in the backward direction, and thus it is desirable to dispose the optical filter 7 as close to the output side as possible so as to protect the components.

In addition, the optical filter 7 can be disposed in other internal components of the optical isolator or may be coated on or attached to other components.

Second Embodiment

When an absorptive optical filter is employed in the optical isolator according to the first exemplary embodiment, the filter, upon receiving light leakage propagating in the backward direction may be heated to be damaged, and eventually the entire optical isolator may be broken. In addition, when a reflective optical filter is employed in the optical isolator according to the first exemplary embodiment, light leakage propagating in the backward direction may be reflected by the filter, and another component of the optical isolator that has received the reflected light leakage may be damaged. This problem becomes much serious in a high power laser system. In view of the above, an optical isolator according to the second exemplary embodiment is different from that of the first exemplary embodiment in that the orientation in which the optical filter is disposed for blocking the light leakage and in that the former further includes a heat dissipation device for discharging heat generated therefrom. Other configurations of the second exemplary embodiment are identical to those of the first exemplary embodiment, and detailed descriptions thereof will therefore not be repeated for brevity. Like reference numerals designate identical or corresponding parts throughout the drawings.

Figure 5:
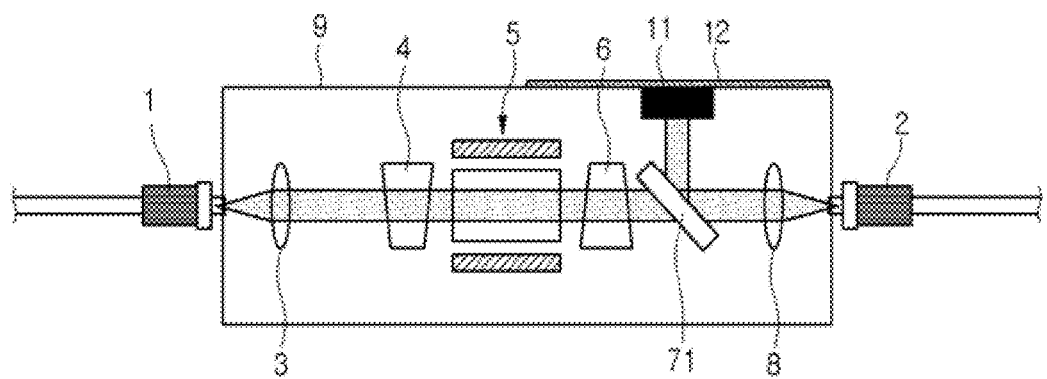
FIG. 5 is a view for illustrating an optical isolator according to a second embodiment.

FIG. 5 is a view for illustrating an optical isolator according to a second embodiment.

Referring to FIG. 5, an optical filter 71 is disposed such that it is sloped with respect to the optical path. The optical filter 71 reflects light leakage that passes through an output-side lens 8 and propagates in the backward direction toward a housing 9. An absorber 11 for absorbing laser light leakage reflected by the optical filter 71 may be further included as a part of the housing or an additional structure. A black body may be used as the absorber 11. Accordingly, the optical filter 71 may be sloped at such an angle that the backward propagating light having passed through the output-side lens 8 is reflected toward the absorber 11.

In addition, a heat sink 12 may be further disposed such that it connects the absorber 11 to the outside of the housing 9, allowing the heat can be dissipated from the absorber 11 to the outside of the housing 9. A heat sink plate, a thermoelectric cooling element, or a heat exchanger may be used as the heat sink 12.

Instead of the absorber 11 and the heat sink 12, an optical window that transmits light leakage without absorbing it may be used. The optical window may be disposed at the same location as the absorber 11, where reflected light leakage travels. By employing the optical window, the light leakage is discharged out of the optical isolator, so that the overall structure of the optical isolator can be more simplified.

Any kind of filter may be used as the optical filter 71 as long as it can reflect light leakage. For example, a notch filter, a short pass filter, a long pass filter, a band pass filter, a beam splitter, a polarization dependent mirror may be used if they has reflection property. It will be expected that the filters should be transparent at the wavelength of an operating light.

According to the second exemplary embodiment, it is possible to prevent the optical filter from being damaged and the optical isolator from being broken due to heat, in addition to the advantages of the first exemplary embodiment, i.e., it is not required to coat every laser diode used as the pump light source, the optical fiber laser can be implemented at a lower cost, and the internal components of the optical isolator can be protected from laser light leakage.

Figure 6:
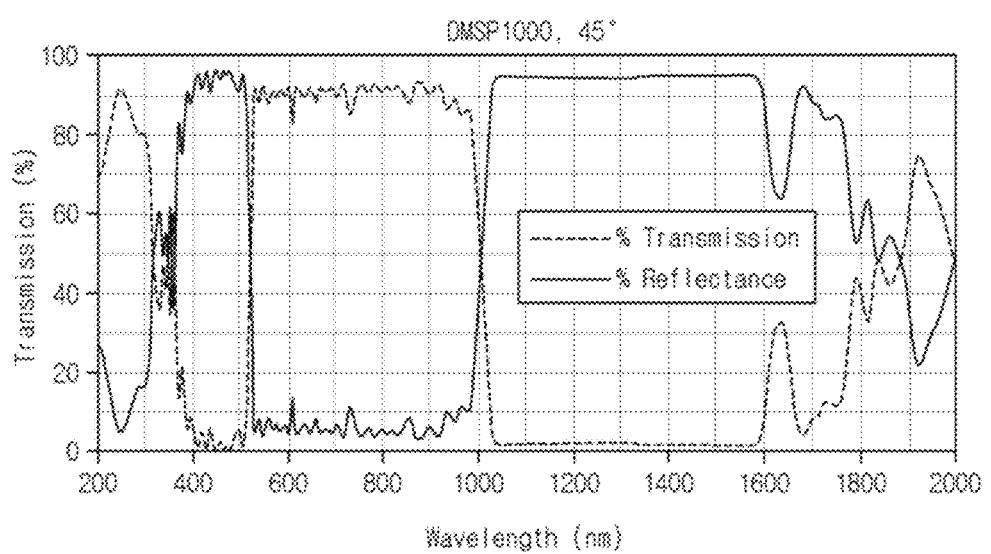
FIG. 6 is a graph showing characteristics of an optical filter used in the second embodiment.

FIG. 6 is a graph showing transmission and reflection characteristics of an optical filter according to the second exemplary embodiment.

Referring to FIG. 6, a short pass filter that reflects light leakage at an specified angle may be used as the optical filter 71. As shown in FIG. 6, where DMSP1000 is used as the short pass filter 71 and it is sloped by forty-five degrees with respect to the optical axis of the propagation, light leakage having a wavelength above 1,000 nm is reflected, whereas operating light having a wavelength below 1,000 nm is transmitted. The short pass filter is not limited to DMSP1000. Short pass filters having high extinction ratio in band pass property and high optical damage threshold characteristics may be preferred for high power laser systems.

Third Embodiment

An optical isolator according to a third exemplary embodiment of the present disclosure is identical to those according to the first and second exemplary embodiments, except for that the former is capable of monitoring power of light leakage to analyze the efficiency of a laser system and others. Accordingly, detailed descriptions of the same elements will not be repeated for brevity FIG. 7 is a view for illustrating an optical isolator according to a third embodiment.

Figure 7:
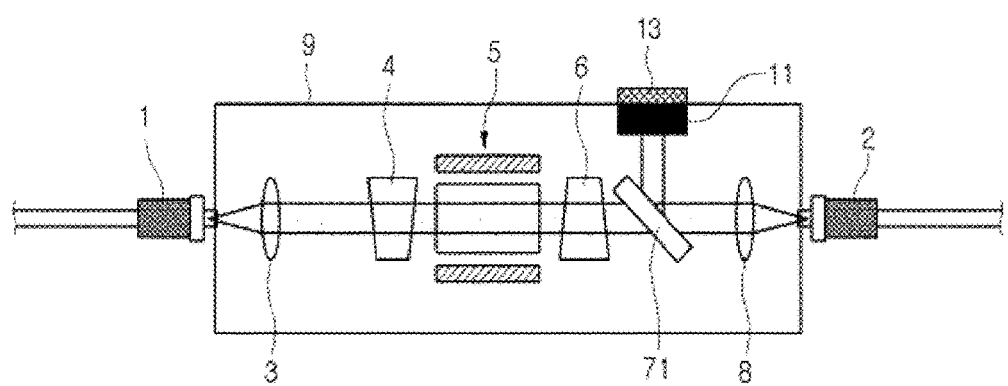
FIG. 7 is a view for illustrating an optical isolator according to a third embodiment.

Referring to FIG. 7, the absorber 11 can be further provided with a sensor 13. The sensor 13 may be, for example, a temperature sensor. A laser light leakage propagating in the backward direction may be absorbed by the absorber 11 to be converted into heat, and the temperature of the heat may be measured by the sensor 13. The power of the laser light leakage can be determined based on the measured temperature. It may be expected that the higher the power is, the lower the efficiency of the optical fiber laser is. One of reasons for low efficiency may be the deterioration in the performance of a laser cavity, and thus the conditions of the optical fiber laser may be easily examined easily using the sensor. If the temperature measured by the sensor 13 exceeds a certain level, it may be considered that the optical isolator itself has been broken or the overall system has deteriorated seriously. In that case, the optical fiber laser system can be interrupted as a protection process to prevent further serious damage to the system.

Fourth Embodiment

An optical isolator according to a fourth exemplary embodiment of the present disclosure is identical to those according to the first to third exemplary embodiments, except for that the former is capable of analyzing the characteristics of a laser light leakage. Accordingly, detailed descriptions of the same elements will not be repeated for brevity FIG. 8 is a view for illustrating an optical isolator according to the fourth embodiment.

Figure 8:
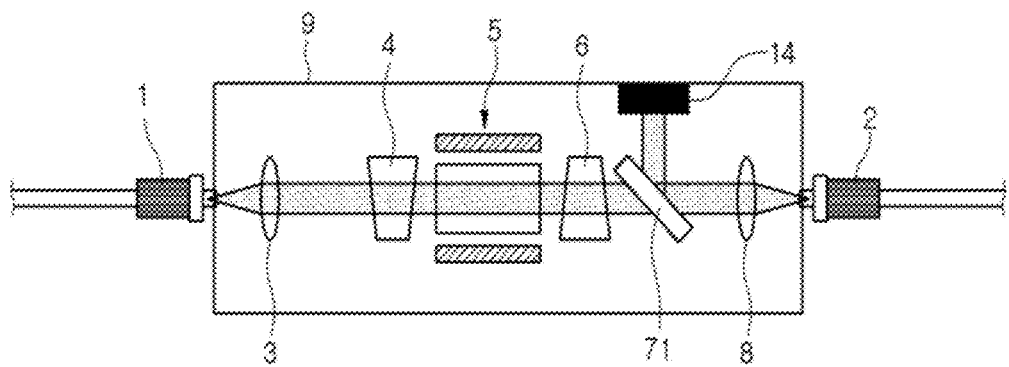
FIG. 8 is a view for illustrating an optical isolator according to a fourth embodiment.
Figure 9:
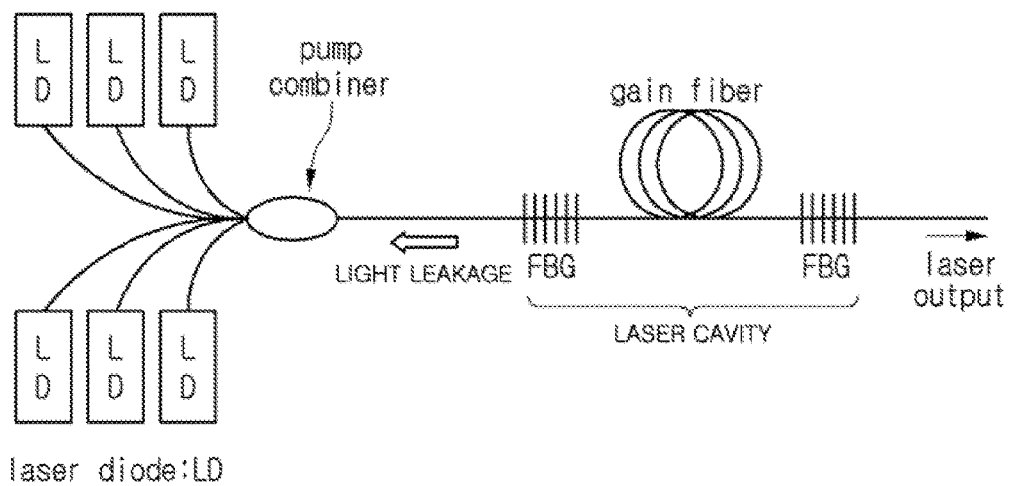
FIGS. 9 and 10 are diagrams for illustrating configurations of optical fiber laser systems in the related art, respectively.
Figure 10:
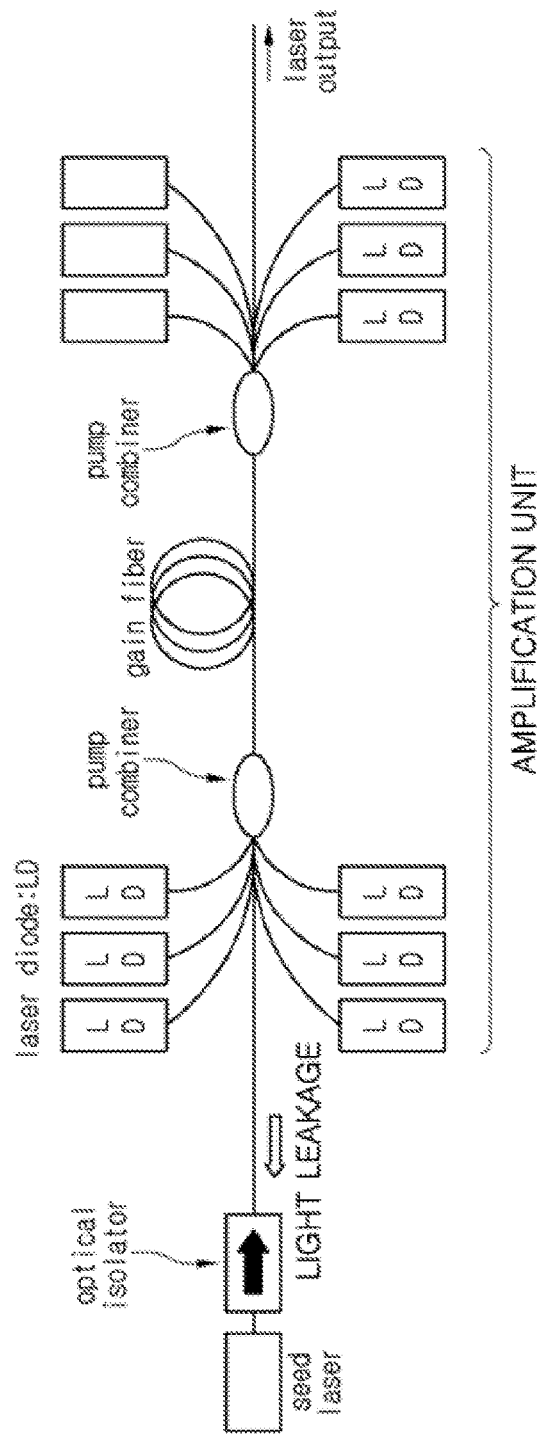

Referring to FIG. 8, a laser light leakage reflected by the optical filter 71 is incident on an opto-electric converter 14. The opto-electric converter 14 is capable of analyzing a laser light leakage accurately to determine the power. When the opto-electric converter 14 is provided as a spectroscope, it can analyze the wavelength to locate a component that generates the light leakage in the optical fiber laser. In addition, when the opto-electric converter 14 is implemented with an image sensor such as a charge coupled device (CCD), it can examine mode field distribution characteristics of the light leakage. In addition, an opto-electric converter that has capability of determining polarization, temporal change or the like of the light leakage may be used, if necessary.

According to exemplary embodiments of the present disclosure, the pump light source, internal components of the optical isolator and the optical fiber laser can be protected reliably. In addition, the overall optical fiber laser system can be implemented at a lower cost by improving the performance of the optical isolator to overcome the light leakage issue of the laser system. Moreover, by monitoring the power or wavelength of the backward propagating light, it is possible to measure the efficiency of the optical fiber laser and examine an abnormally operating component.

Other embodiments falling within the scope of the present disclosure will be described. The input-side polarizer, the Faraday rotator and the output-side polarizer, which utilize the Faraday effect, may be replaced by other types of components for the optical isolator. However, the idea of the present disclosure may be applied more preferably for the optical isolator utilizing the Faraday effect, when the efficiency of blocking light leakage deteriorates according to the dispersion characteristics of the Faraday rotator and polarizer.

In addition, a plurality of same or different optical filters may be used instead of the single optical filter. With the plurality of optical filters, various filtering operations can be performed including protecting the optical filter from being damaged or deteriorating due to distribution effects, increasing overall efficiency of blocking light leakage, or blocking light leakage generated at multiple wavelengths.

Moreover, by adding an optical fiber input end to which operating light is delivered and an input-side lens generating parallel light beams to the input-side polarizer of the optical isolator according to the basic embodiment, it is possible to implement an optical isolator having the fiber-to-free space structure.

According to exemplary embodiments of the present disclosure, an optical fiber laser, especially the optical isolator and the pump light source can be protected reliably. The optical fiber laser can be protected by simply adding an optical component to an existing optical isolator without any additional component, and thus the optical fiber laser system can be implemented at a lower cost. Moreover, the light leakage issue can be easily overcome by simply replacing an optical isolator in an existing optical fiber laser with the optical isolator according to any one of the exemplary embodiments of the present disclosure. Accordingly, the optical isolator exhibits high industrial applicability.

Moreover, by monitoring the power or wavelength or other characteristics of the backward propagating light, it is possible to measure the efficiency of the optical fiber laser and locate an abnormally operating component.

What is claimed is:

1. An optical isolator comprising:
   an input-side lens converting an operating light incident in a forward direction via an optical fiber input end into parallel light beams;
   an input-side polarizer disposed on an output side of the input-side lens;
   a Faraday rotator rotating a polarization plane of the operating light having been converted into the parallel light beams;
   an output-side polarizer disposed on an output side of the Faraday rotator;
   an output-side lens transmitting the operating light having passed through the output-side polarizer;
   an optical filter configured to transmit the operating light and to block a leaking light traveling in a direction opposite to the operating light, wherein the optical filter is configured to transmit the operating light and block the leaking light based on a wavelength difference between the operating light and the leaking light;
   an optical fiber output end that the operating light exits; and
   a housing accommodating the input-side lens, the input-side polarizer, the Faraday rotator, the output-side polarizer, the output-side lens, the optical filter and the optical fiber output end therein to enclose them.

2. The optical isolator of claim 1, further comprising: at least one selected from one or more lenses, Faraday rotators, polarizers, wave plates, polarization rotators, birefringent plates, slits, mirrors and prisms, between the input-side lens and the output-side lens.

3. The optical isolator of claim 1, wherein the optical filter is disposed between the output-side lens and the output-side polarizer.

4. The optical isolator of claim 1, wherein the optical filter is a wavelength-selective, absorptive optical filter absorbing the light leakage.

5. The optical isolator of claim 4, wherein the wavelength-selective, absorptive optical filter is disposed between
   the optical fiber input end, the input-side lens, the input-side polarizer, the Faraday rotator, the output-side polarizer, the output-side lens and the optical fiber output end
   or
   provided together with at least one selected from one or more lenses, Faraday rotators, polarizers, wave plates, polarization rotators, birefringent plates, slits, mirrors and prisms, between the input-side lens and the output-side lens.

6. The optical isolator of claim 1, wherein the optical filter is a wavelength-selective, reflective optical filter reflecting the light leakage.

7. The optical isolator of claim 6, wherein the wavelength-selective, reflective optical filter is disposed between
   the optical fiber input end, the input-side lens, the input-side polarizer, the Faraday rotator, the output-side polarizer, the output-side lens and the optical fiber output end
   or
   provided together with at least one selected from one or more lenses, Faraday rotators, polarizers, wave plates, polarization rotators, birefringent plates, slits, mirrors and prisms, between the input-side lens and the output-side lens.

8. The optical isolator of claim 1, wherein the optical filter is at least one of a notch filter, a short pass filter, a long pass filter, a band pass filter, a wavelength dependent beam splitter and a wavelength dependent mirror.

9. The optical isolator of claim 1, wherein the optical filter reflects the light leakage, and wherein the optical isolator further comprises an absorber absorbing the reflected light leakage.

10. The optical isolator of claim 9, further comprising: a sensor measuring a condition of the absorber.

11. The optical isolator of claim 9, further comprising: a heat sink removing a heat of the absorber.

12. The optical isolator of claim 1, wherein the optical filter reflects the light leakage, and
    wherein the optical isolator further comprises an optical window discharging the reflected light leakage out of the optical isolator.

13. The optical isolator of claim 1, wherein the optical filter reflects the light leakage, and
    wherein the optical isolator further comprises an opto-electric converter detecting the reflected light leakage.

14. An optical isolator comprising:
    an input-side polarizer on which an operating light is incident as parallel light beams;
    a Faraday rotator rotating a polarization plane of the operating light having passed through the input-side polarizer;
    an output-side polarizer that the operating light having passed through the Faraday rotator passes; and
    an optical filter configured to transmit the operating light and to block a leaking light traveling in a direction opposite to the operating light, wherein the optical filter is configured to transmit the operating light and block the leaking light based on a wavelength difference between the operating light and the leaking light.

15. The optical isolator of claim 14, further comprising: an input-side lens converting the operating light incident via an optical fiber input end into parallel light beams to deliver them to the input-side polarizer.

16. The optical isolator of claim 14, further comprising: at least one selected from one or more lenses, Faraday rotators, polarizers, wave plates, polarization rotators, birefringent plates, slits, mirrors and prisms, between the input-side polarizer and the output-side polarizer.

17. The optical isolator of claim 14, comprising: an absorber absorbing light leakage reflected by the optical filter; and a heat sink discharging a heat of the absorber.

18. The optical isolator of claim 14, comprising: an absorber absorbing light leakage reflected by the optical filter; and a sensor measuring a temperature of the absorber.

19. The optical isolator of claim 14, comprising: an optical window discharging the reflected light leakage from the optical filter out of the optical isolator.

20. The optical isolator of claim 14, comprising: an opto-electric converter measuring light leakage reflected by the optical filter.

* * * * *